United States Patent
Behfar (10) Patent No.: US 10,103,517 B2
(45) Date of Patent: *Oct. 16, 2018

(54) HIGH RELIABILITY ETCHED-FACET PHOTONIC DEVICES

(71) Applicant: MACOM Technology Solutions Holdings, Inc., Lowell, MA (US)

(72) Inventor: Alex A. Behfar, Keswick, VA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/296,162

(22) Filed: Jun. 4, 2014

(65) Prior Publication Data
US 2014/0286370 A1    Sep. 25, 2014

Related U.S. Application Data

(63) Continuation of application No. 11/356,203, filed on Feb. 17, 2006, now Pat. No. 8,787,419.

(Continued)

(51) Int. Cl.
| | |
|---|---|
| *H01S 5/028* | (2006.01) |
| *H01S 5/323* | (2006.01) |
| *H01S 5/22* | (2006.01) |
| *G02F 1/17* | (2006.01) |
| *H01S 5/02* | (2006.01) |
| *H01S 5/16* | (2006.01) |
| *H01S 5/00* | (2006.01) |

(52) U.S. Cl.
CPC ............... *H01S 5/323* (2013.01); *G02F 1/17* (2013.01); *H01S 5/0201* (2013.01); *H01S 5/028* (2013.01); *H01S 5/0282* (2013.01); *H01S 5/22* (2013.01); *H01S 5/0042* (2013.01); *H01S 5/0202* (2013.01); *H01S 5/0203* (2013.01); *H01S 5/16* (2013.01); *H01S 5/2214* (2013.01)

(58) Field of Classification Search
CPC ............................ H01S 5/0203; H01S 5/0282
USPC ....................................... 372/49.01
See application file for complete search history.

(56) References Cited

U.S. PATENT DOCUMENTS

| | | | |
|---|---|---|---|
| 4,851,368 | A | 7/1989 | Behfar-Rad et al. |
| 5,559,819 | A | 9/1996 | Abe et al. |

(Continued)

FOREIGN PATENT DOCUMENTS

| | | |
|---|---|---|
| EP | 0856894 | 8/1998 |
| EP | 1406360 | 4/2004 |

OTHER PUBLICATIONS

Behfar-Rad, A. et al., "Monolithic AlGaAs—GaAs single quantum-well ridge lasers fabricated with dry-etched facets and ridges," IEEE Journal of Quantum Electronics, vol. 28, pp. 1227-1231 (May 1992).

(Continued)

*Primary Examiner* — Tod T Van Roy
(74) *Attorney, Agent, or Firm* — Wilmer Cutler Pickering Hale and Dorr LLP (57) ABSTRACT

Semiconductor photonic device surfaces are covered with a dielectric or a metal protective layer. The protective layer covers the entire device, including regions near facets at active regions, to prevent bare or unprotected semiconductor regions, thereby to form a very high reliability etched facet photonic device.

18 Claims, 6 Drawing Sheets

Related U.S. Application Data

(60) Provisional application No. 60/653,984, filed on Feb. 18, 2005.

(56) References Cited

U.S. PATENT DOCUMENTS

| | | | |
|---|---|---|---|
| 5,851,849 A | 12/1998 | Comizzoli et al. | |
| 6,289,030 B1 * | 9/2001 | Charles | 372/49.01 |
| 6,537,841 B2 | 3/2003 | Takei et al. | |
| 6,835,581 B2 * | 12/2004 | Fitz et al. | 438/22 |
| 7,083,994 B2 | 8/2006 | O'Gorman | |
| 7,285,806 B2 * | 10/2007 | Nishi et al. | 257/192 |
| 2002/0061044 A1 | 5/2002 | Kuniyasu et al. | |
| 2002/0110341 A1 * | 8/2002 | Yuang | 385/129 |
| 2003/0026317 A1 * | 2/2003 | Behfar | 372/94 |
| 2004/0071175 A1 | 4/2004 | Chikugawa | |
| 2004/0115847 A1 | 6/2004 | Hasegawa et al. | |
| 2004/0233950 A1 * | 11/2004 | Furukawa et al. | 372/43 |
| 2005/0030995 A1 * | 2/2005 | Kawakami | H01S 5/10 |
| | | | 372/43.01 |
| 2005/0173694 A1 | 8/2005 | Mawst et al. | |
| 2005/0190807 A1 | 9/2005 | Toyama | |

OTHER PUBLICATIONS

Supplementary European Search Report and Written Opinion for European Patent Application No. 06735363, dated Mar. 3, 2011, 7 pages.

* cited by examiner

HIGH RELIABILITY ETCHED-FACET PHOTONIC DEVICES

CROSS-REFERENCE TO RELATED APPLICATIONS

This patent application is a continuation of U.S. patent application Ser. No. 11/356,203, filed Feb. 17, 2006, which claims priority to U.S. Provisional Patent Application No. 60/653,984, filed Feb. 18, 2005, each of which is hereby incorporated by reference herein in its entirety.

FIELD OF THE INVENTION

The present invention relates, in general, to etched-facet photonic devices, and more particularly to improved etched-facet laser devices having sealed contact openings and to methods for fabricating them.

BACKGROUND OF THE INVENTION

Semiconductor lasers typically are fabricated on a wafer by growing an appropriate layered semiconductor material on a substrate through Metalorganic Chemical Vapor Deposition (MOCVD) or Molecular Beam Epitaxy (MBE) to form an epitaxy structure having an active layer parallel to the substrate surface. The wafer is then processed with a variety of semiconductor processing tools to produce a laser optical cavity incorporating the active layer and incorporating metallic contacts attached to the semiconductor material. Laser mirror facets typically are formed at the ends of the laser cavity by cleaving the semiconductor material along its crystalline structure to define edges, or ends, of the laser optical cavity so that when a bias voltage is applied across the contacts, the resulting current flow through the active layer causes photons to be emitted out of the faceted edges of the active layer in a direction perpendicular to the current flow. Since the semiconductor material is cleaved to form the laser facets, the locations and orientations of the facets are limited; furthermore, once the wafer has been cleaved it typically is in small pieces so that conventional lithographical techniques cannot readily be used to further process the lasers.

The foregoing and other difficulties resulting from the use of cleaved facets led to the development of a process for forming the mirror facets of semiconductor lasers through etching. This process, as described in U.S. Pat. No. 4,851,368, also allows lasers to be monolithically integrated with other photonic devices on the same substrate. This work was further extended and a ridge laser process based on etched facets was disclosed in the IEEE Journal of Quantum Electronics, volume 28, No. 5, pages 1227-1231, May 1992. However, the etched facets produced by these processes have been found to have low reliability, especially in non-hermetic environments, because the process results in a structure in which unprotected semiconductor material near the laser facet at the active area is directly exposed to the ambient atmosphere. This exposure causes the facets to degrade over time, reducing the reliability of such etched facet photonic devices.

SUMMARY OF THE INVENTION

Since high reliability for etched facet devices is extremely desirable, an improved process and method for making an etched-facet semiconductor photonic device is provided in accordance with the present invention. In this process, a photonic device such as a laser having etched facets is coated with a dielectric, preferably silicon dioxide deposited through PECVD (plasma enhanced chemical vapor deposition). This dielectric is removed from the photonic device only in those regions where it is necessary to provide openings for metallic contacts. These contact openings are then completely sealed by the metal contacts. The resulting devices demonstrate highly reliable operation, even in non-hermetic environments.

BRIEF DESCRIPTION OF DRAWINGS

The foregoing, and additional objects, features and advantages of the present invention will be apparent to those of skill in the art from the following detailed description of preferred embodiments thereof, taken with the accompanying drawings, in which:

FIGS. 4 ($a$ & $b$) through 8($a$ & $b$) illustrate cross-sectionally the fabrication steps for making a solid state etched facet laser on a wafer in accordance with the prior art;

FIGS. 10 ($a$ & $b$) through 14 ($a$ & $b$) illustrate cross-sectionally the fabrication steps for making a solid state etched facet laser in accordance with the present invention.

DETAILED DESCRIPTION OF PREFERRED EMBODIMENTS

Figure 1:
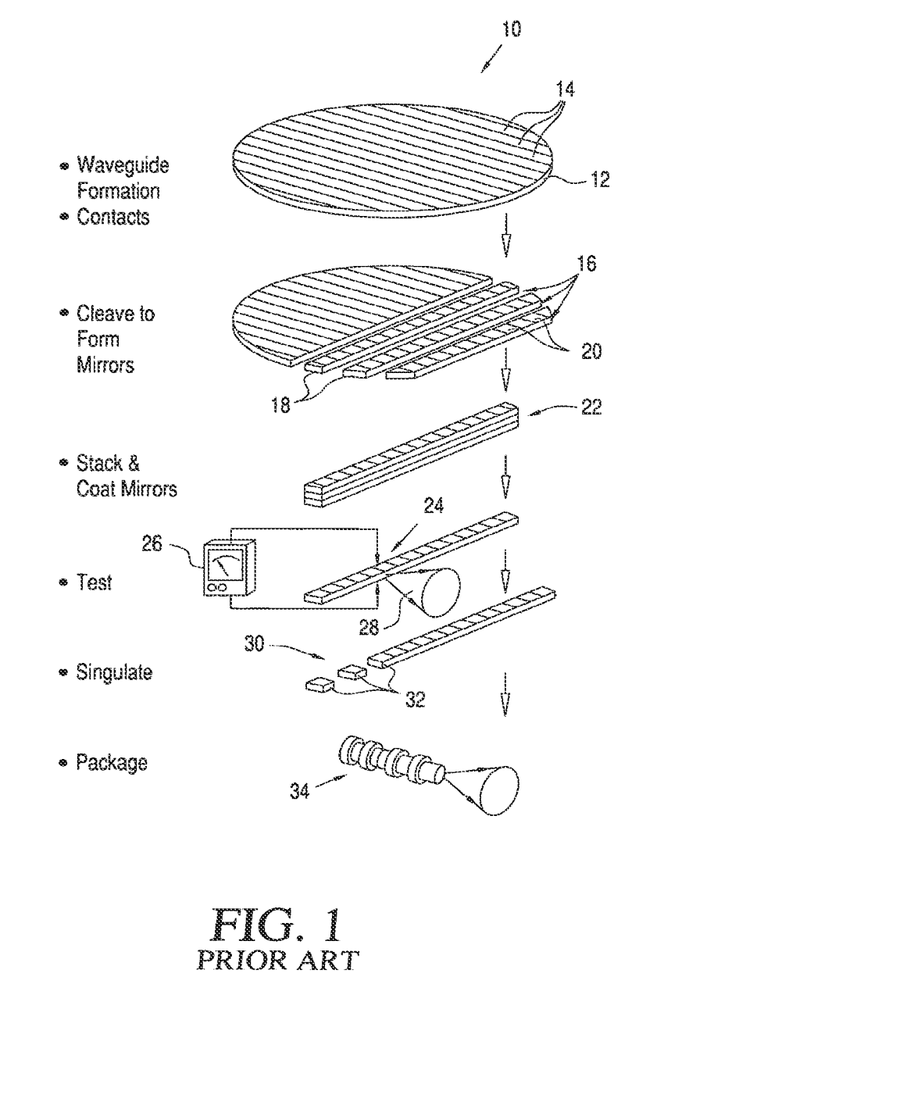
FIG. 1 illustrates a conventional cleaved facet process for fabricating photonic devices such as lasers on a wafer.

As generally illustrated at 10 in FIG. 1, mechanical cleaving of semiconductor epi wafers 12 is the usual process for defining reflective mirrors, or facets, at the cavity ends of edge-emitting diode lasers. In this process, multiple waveguides 14 are fabricated on the wafer substrate, a metal contact layer is applied, and the wafer is mechanically cleaved, as along cleave lines 16, to form bars 18 of laser devices 20. The bars 18 are then stacked, as illustrated at 22, and the cleaved end facets of the laser devices are coated to provide the desired reflection and emission characteristics. The individual laser devices 20 may then be tested, as at 24, by applying a bias voltage 26 across the individual lasers, and detecting the resulting output light beam 28. The bars of laser devices may then be separated, or singulated, as at 30, to produce individual chips 32 each containing one or more laser devices that may be suitably packaged, in known manner, as at 34.

For most semiconductor devices, however, the foregoing cleaving process is imprecise, for it relies on the location and angle of the crystalline planes of the semiconductor material. With some materials, for example, there may be cleave planes of approximately equal strength that are oriented at such acute angles to one another that minute perturbations occurring during cleaving can redirect a fracture interface from one cleave plane to another. Furthermore, the cleaving process illustrated in FIG. 1 creates fragile bars and miniscule chips that are awkward to handle during testing and packaging. In addition, mechanical cleaving tends to be incompatible with later processing of the individual chips, as would be needed to provide a monolithic integration of components on a chip, for example, since the wafer must physically be broken to obtain fully functional lasers.

Figure 2:
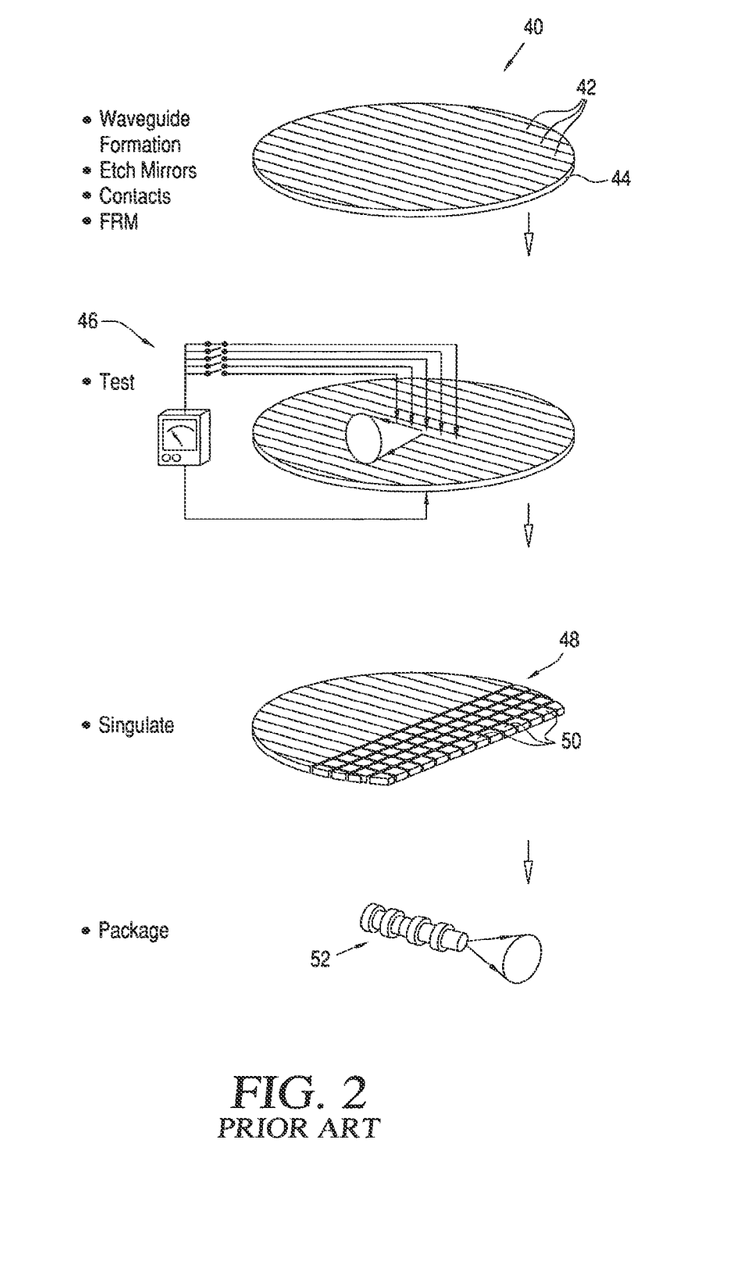
FIG. 2 illustrates a conventional etched facet process for fabricating photonic devices such as lasers on a wafer.

An alternative technology for fabricating photonic devices such as lasers is generally illustrated at 40 in FIG. 2, wherein as a first step multiple waveguides 42 are fabricated on a suitable wafer substrate 44. These are preferably parallel waveguides that extend across the wafer, as illustrated. A process based on photolithography and chemically-assisted ion-beam etching (CAIBE) is then used to form facets at desired locations along the waveguides to produce laser waveguide cavities. These facets are precisely located, and have a quality and reflectivity that is equivalent to those obtained by cleaving. Since the laser cavities and facets are fabricated on the wafer much the same way that integrated circuits are fabricated on silicon, this process allows the lasers to be monolithically integrated with other photonic devices on a single chip, and allows the devices to be tested inexpensively while still on the wafer, as indicated at 46. Thereafter, the wafer may be singulated, as at 48, to separate the chips 50, and the chips may then be packaged, as illustrated at 52. This process has a high yield and low cost, and allows the manufacture of lasers having cavities of selected lengths.

The prior art fabrication process of FIG. 2 is described in greater detail in "Monolithic AlGaAs—GaAs Single Quantum-Well Ridge Lasers Fabricated with Dry-Etched Facets and Ridges," A. Behfar-Rad and S. S. Wong, IEEE Journal of Quantum Electronics, Vol. 28, pp. 1227-1231, May 1992, and is illustrated in FIGS. 3 to 8 (a & b) herein. In this example, multiple ridge lasers, such as lasers 60 and 62, are fabricated on waveguides 42 on the wafer 44. Such lasers are used in many applications where single spatial mode output beams are desirable, with the ridge laser providing optical confinement in the lateral (side-to-side) and transverse (vertical) dimensions as viewed in FIG. 3. The transverse confinement is a direct result of the underlying semiconductor layers (to be described), while the lateral confinement arises from an etch which defines the ridge. The regions adjacent to the ridge are etched down to near the active region in the semiconductor layer, which causes a drop in the index of refraction in these regions and gives rise to the lateral confinement.

Figure 3:
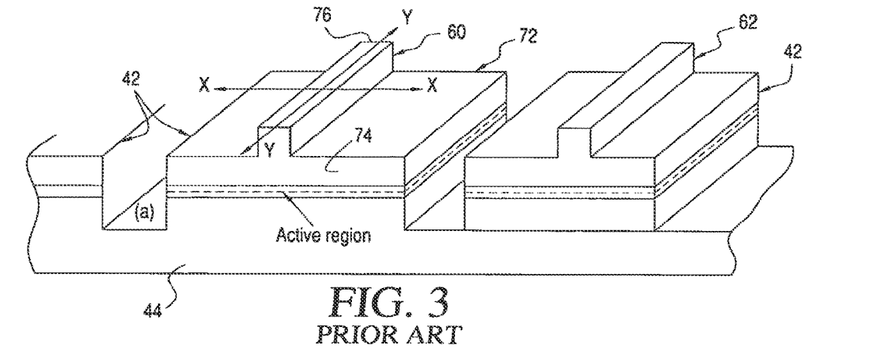
FIG. 3 shows a perspective view of the structure on a wafer in accordance with the prior art.
Figure 4A:
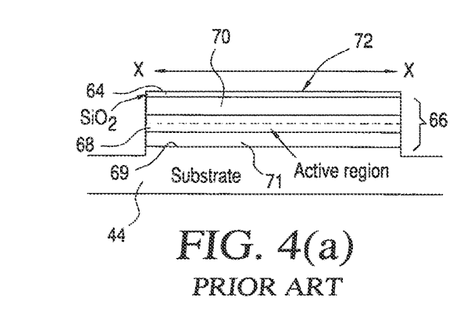
Figure 4B:
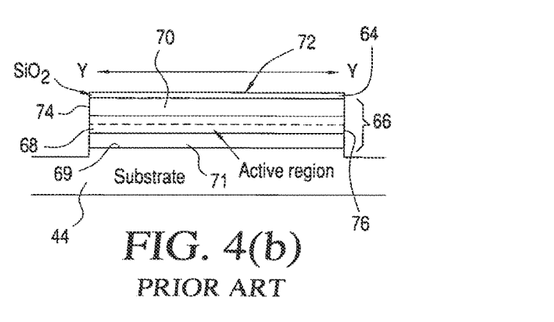

The process of fabricating the ridge lasers is illustrated in FIGS. 4(a & b)-8(a & b), to which reference is now made. In these figures, lateral cross-sections along line x-x of ridge 60 in FIG. 3 are shown in FIGS. 4(a), 5(a), 6(a), 7(a), and 8(a), while longitudinal cross-sections along line y-y of ridge 60 in FIG. 3 are shown in FIGS. 4(b), 5(b), 6(b), 7(b), and 8(b). It will be understood that the dimensions in these figures are not necessarily to scale. The illustrated process involves four photolithographic patterning steps, with key fabrication steps being shown in the Figures. As illustrated in FIGS. 4(a) and 4(b), a 500 nm thick dielectric layer 64, which usually is an $SiO_2$ layer, is deposited on an epitaxially grown laser structure 66, as by plasma-enhanced chemical vapor deposition (PECVD). The laser structure incorporates an active region 68 parallel to the top surface 69 of the substrate 44 and has upper and lower cladding regions 70 and 71, respectively, above and below the active region. A first lithographic step is performed, using a spun-on photoresist layer and photolithography to produce a pattern in the photoresist material to define a laser body 72 with end facets 74 and 76. The photoresist pattern is transferred to the underlying $SiO_2$ layer 64, using $CHF_3$ reactive ion etching (RIE), to produce a mask. After the photoresist is removed by an oxygen plasma, the $SiO_2$ mask pattern is transferred to the laser structure 66 using $Cl_2$-based chemically-assisted ion beam etching (CAIBE). The CAIBE parameters may be as follows: 500 eV $Ar^+$ ions at a current density of 0.1 mA/cm$^2$, $Cl_2$ flow rate of 30 ml/min, substrate temperature at or close to room temperature, an etch rate of 90 nm/min for AlGaAs, and a sputter rate of 4.5 nm/min for $SiO_2$.

Figure 5A:
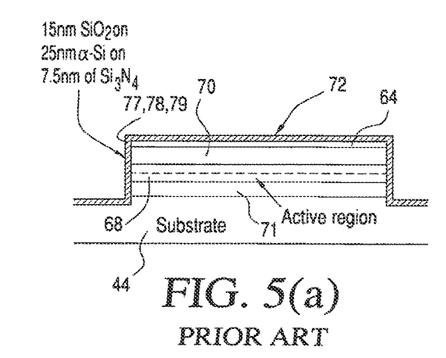
Figure 5B:
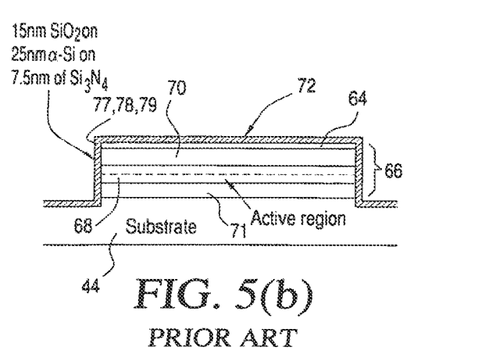

As illustrated in FIGS. 5(a) and 5(b), a 7.5 nm thick $Si_3N_4$ layer 77, a 25 nm thick amorphous Si (a-Si) layer 78, and a 15 nm thick $SiO_2$ layer 79 are then sequentially deposited by PECVD. The thicknesses of these layers are kept small to avoid modification of the facet reflectivity.

Figure 6A:
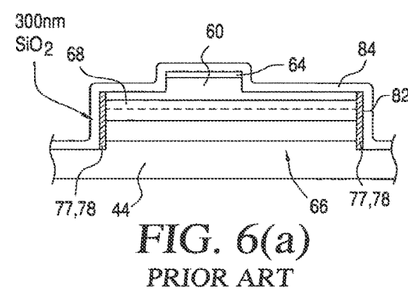
Figure 6B:
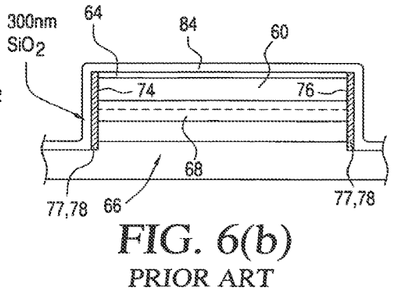

A second lithography to produce patterns for ridges, such as the ridges 60 and 62 of FIG. 3, is performed, with ridge 60 being illustrated in FIGS. 6(a) and (b). Thereafter, a $CF_4$ RIE is used to transfer the ridge patterns to the PECVD $SiO_2$ layer 64. This RIE step etches through the $Si_3N_4$ and α-Si layers 77 and 78 on top of the structure without removing these layers from the sides of the structure, as illustrated in FIGS. 6(a) and (b), and removes small portions of the epitaxially-grown laser structure 66. After removing the photoresist with an oxygen plasma, another CAIBE step is used to form the ridge 60 in the laser structure.

Figure 7A:
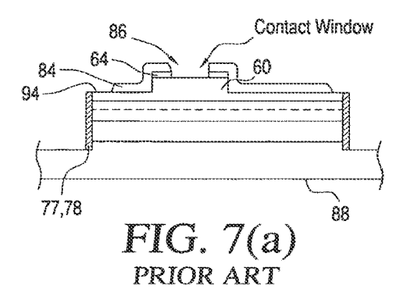
Figure 7B:
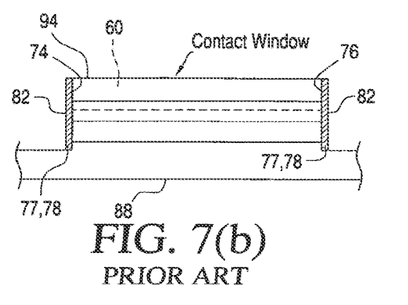
Figure 8A:
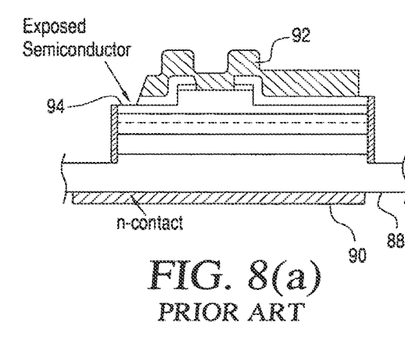
Figure 8B:
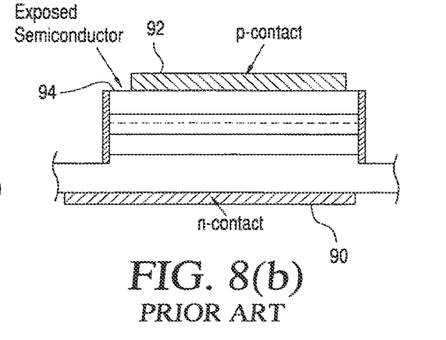
Figure 9:
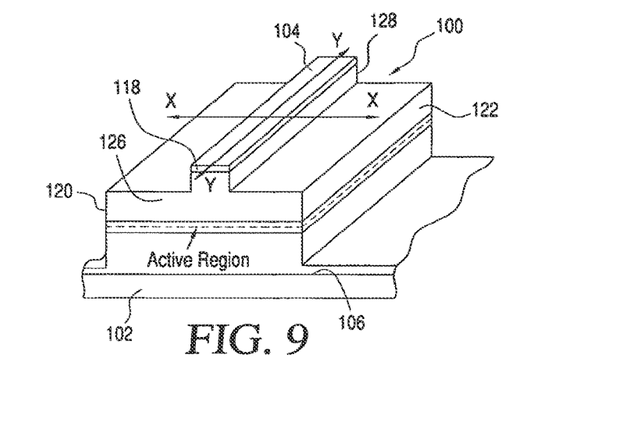
FIG. 9 shows a perspective view of the structure on a wafer in accordance with the present invention.

Next, a 300 nm thick PECVD dielectric layer 84, such as $SiO_2$, is deposited (FIGS. 6(a) and 6(b)) and a third lithography for defining p-contact holes such as hole 86 is performed (FIGS. 7(a) and 7(b)). A combination of $CF_4$ RIE and buffered HF solution is used to open the contact hole in the $SiO_2$ layers 64 and 84; the buffered HF also removes the oxide from the facets 74 and 76, while the 25 nm thick layer of α-Si 78 is able to protect the facets (buffered HF attacks the AlGaAs cladding layers). The underlying 7.5 nm $Si_3N_4$ layer 77 is sufficiently thick to prevent the α-Si layer 78 from having direct contact with the facet of the laser structure. Without the $Si_3N_4$ layer, the α-Si might n-type dope the facets of the lasers and form a leakage path for the current along the facets.

Oxygen plasma is then used to remove the photoresist layer. Next, the wafer is placed face down on a Si carrier having a photoresist layer, and an oxygen plasma is performed to remove any unwanted organic materials from the back side, or bottom surface 88 of the sample. This is followed by a dip in a HCl: $H_2O$ (1:1) to expose a clean surface for metallization. Thermal evaporation is then used to deposit a layer 90 incorporating 75 nm of AuGeNi, 100 nm of Ag, and 150 nm of Au to form an n contact on the bottom of the wafer. The wafer 44 is removed from the carrier by soaking in acetone, and the n contact is annealed in a rapid thermal annealer (RTA) at 450° C. in an Ar ambient for 1 min. Next, the lithography for p-contact metallization on the top of the wafer is performed. After a short oxygen plasma treatment and a dip in a HCl: $H_2O$ (1:1) solution, a metallic layer 92 of 15 nm of Cr followed by 500 nm of Au is thermally evaporated onto the top surface of the laser cavity. Acetone is used to lift off the unwanted metal on the photoresist, and a 1 min RTA at 350° C. in an Ar ambient is used to anneal the p contact.

The same dielectric mask that defines the facet in the first CAIBE etch also defines the ridge during the second CAIBE step and, therefore, the lasers are self-aligned, i.e., there is no misalignment between the facets and the ridge ends. The patterning of the dielectric is achieved with a ridge level photoresist that extends beyond the two laser facets. In this way, any small photolithographic misalignment does not adversely affect the self-aligned definition of the laser.

As illustrated in FIG. 7(a), the process of opening the contact window 86 in the dielectric insulating layer 84 on the top surface of the ridge 60 tends to remove the protective insulating material 84 from the semiconductor near the etched facets 74 and 76, leaving an area 94 of the completed photonic device as exposed semiconductor. This subjects the unprotected area to damage and reduces the reliability of the final product.

The foregoing problem is overcome by the present invention, as illustrated diagrammatically in FIGS. 9 through 14(a & b), wherein a process for fabricating a highly reliable photonic device 100 on a substrate 102 is illustrated. As noted above, the dimensions in these figures are not necessarily to scale. Although the invention will be described in terms of a ridge laser 104, such as that illustrated in FIG. 9, it will be understood that other types of lasers or other photonic devices may also be fabricated.

Figure 10A:
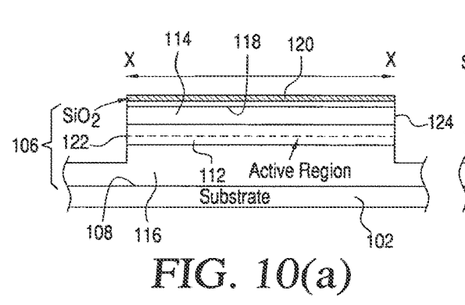
Figure 10B:
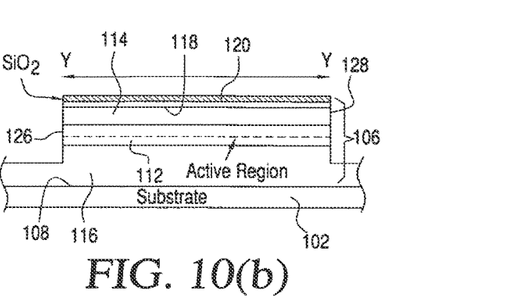

As is conventional, the substrate 102 may be a wafer formed, for example, of a type III-V type compound, or an alloy thereof, which may be suitably doped. As illustrated in FIGS. 10(a) and 10(b), which are cross-sections of the device of FIG. 9 taken along lines x-x and y-y, respectively, a succession of layers 106 may be deposited on a top surface 108 of the substrate 102, as by epitaxial deposition such as Metalorganic Chemical Vapor Deposition (MOCVD) or Molecular Beam Epitaxy (MBE). These layers form an optical waveguide in the transverse direction that typically includes an active region 112 and upper and lower cladding regions 114 and 116, as illustrated in FIGS. 10(a) and 10(b). FIG. 10(a) is a cross-section taken at the x-x axis of the waveguide 100 of FIG. 9, while FIG. 10(b) is a cross-section taken at the waveguide taken along the y-y axis of FIG. 9.

In one example, the semiconductor laser photonic device structure layers 106 are epitaxially formed on an InP substrate 102. The upper and lower cladding regions 114 and 116, respectively, of the photonic structure are formed from a semiconductor material such as InP which has a lower index than the index of the active region 112. These cladding regions are adjacent the active region, which may be formed with AlInGaAs-based quantum wells and barriers. An InGaAs cap layer 118 is provided on the upper cladding layer 114 to allow ohmic contacts. Although this example is based on providing a photonic device consisting of a laser device on an InP substrate, it will be understood that other photonic devices with active regions can be fabricated, and that these devices can be formed on other substrates such as GaAs and GaN. Examples of such photonic devices are electroabsorption modulators and semiconductor optical amplifiers.

In the process of the invention, a dielectric masking layer, such as a 200 nm thick layer 120 of SiO$_2$, is deposited on the epitaxially grown laser structure 106 by plasma-enhanced chemical vapor deposition (PECVD), as illustrated in FIGS. 10(a) and 10(b). A first lithographic step defining, for example, a laser body and facets in a photoresist layer, is performed on the wafer 44 of FIG. 2, and the photoresist pattern is transferred to the underlying SiO$_2$ mask layer 120 using reactive ion etching (RIE). The photolithography steps of spinning a photoresist layer onto the mask layer 120, exposing the photoresist through a lithographic mask to produce a pattern, and thereafter transferring the pattern to the mask layer 120 are not illustrated, since they are conventional and well-known in the art. After the photoresist is removed by oxygen plasma, the SiO$_2$ pattern in layer 120 is transferred to the laser structure using chemically assisted ion beam etching (CAIBE), to form the laser waveguides 42 (FIG. 2) and to form discrete laser cavities 100 (FIG. 9) having side walls 122 and 124 and end facets 126 and 128.

Figure 11A:
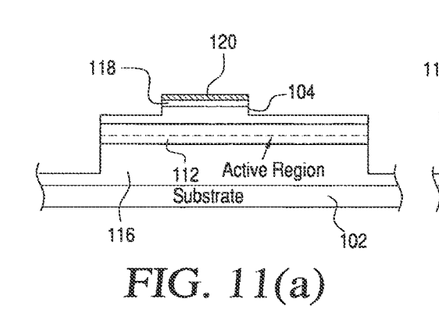
Figure 11B:
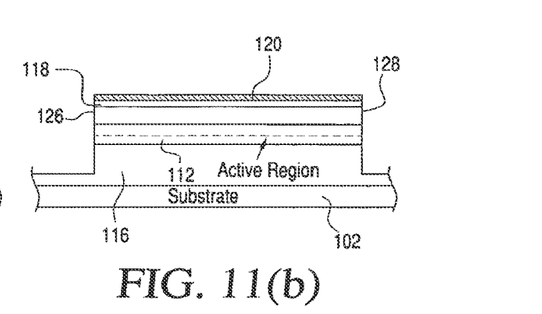

A second photoresist lithography to produce a pattern defining one or more ridges such as ridge 104 on the previously defined laser bodies on the substrate is performed and RIE is used to transfer the photoresist pattern to the PECVD SiO$_2$ mask layer 120. After removing the photoresist with oxygen plasma, CAIBE is used to form the ridges 104 for each laser body in the laser structure as illustrated in FIGS. 11(a) and 11(b). Although a single ridge 104 is illustrated, it will be understood that multiple photonic devices preferably are fabricated on a single substrate. As illustrated, for example, in FIG. 2, multiple spaced-apart waveguides 42, each of which may incorporate multiple ridge lasers, usually are fabricated on the wafer, and after completion of the process steps described below, they are separated for packaging by a singulation, or dicing, procedure, as discussed above, to produce individual photonic devices.

Figure 12A:
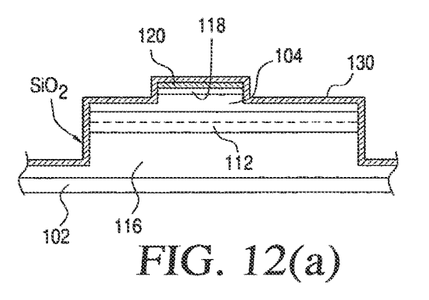
Figure 12B:
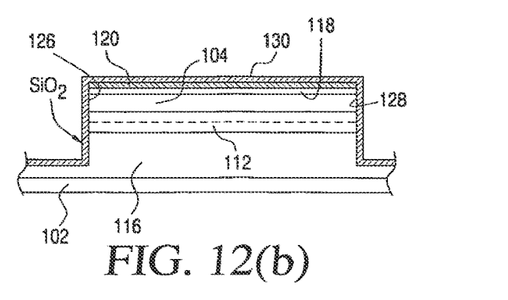
Figure 13A:
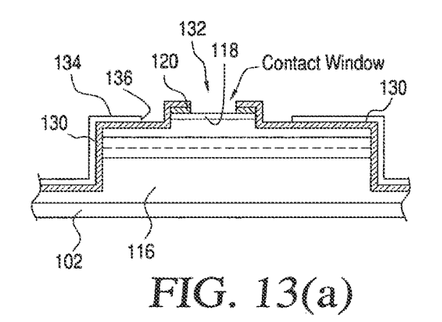
Figure 13B:
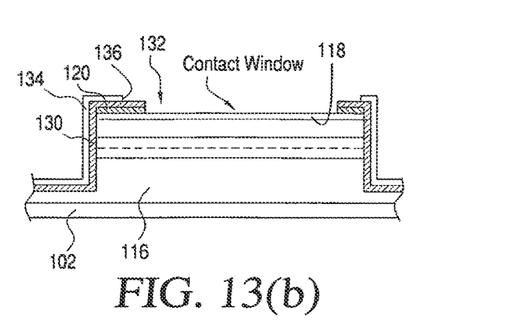

After formation of the laser bodies, facets and ridges which are described above with respect to FIGS. 11(a) and 11(b), and before the singulation step of FIG. 2, a 120 nm thick passivation layer 130 of a dielectric material such as SiO$_2$ is deposited, using PECVD, to cover the entire wafer, including the photonic devices, as illustrated in FIGS. 12(a) and 12(b). This is illustrated for a single ridge in FIG. 12(a). Thereafter, a third lithography for defining a p-contact opening on the photonic structure is performed and RIE is used to open a contact hole 132 in the SiO$_2$ layers 120 and 130, as illustrated in FIGS. 13(a) and 13(b). Oxygen plasma is then used to remove the photoresist.

Figure 14A:
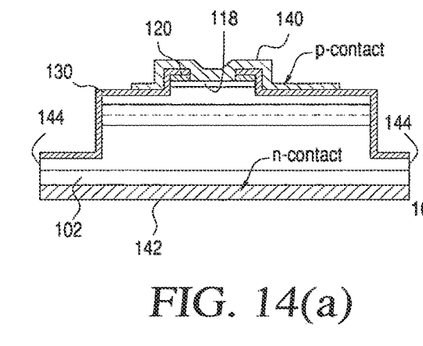
Figure 14B:
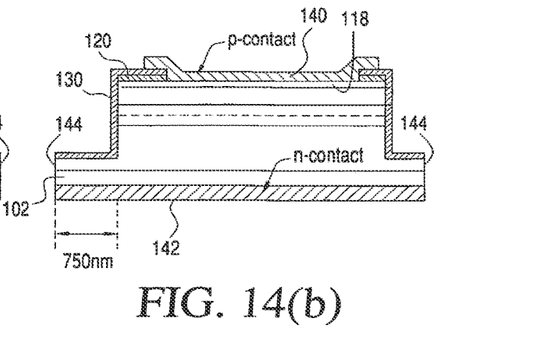

A fourth lithography is performed to define a metallization lift-off pattern 134 for a p-contact, wherein the lift-off structure 134 is lithographically defined to produce a contact opening 136 surrounding the contact window 132. The under-cut that a typical lift-off structure possesses has not been shown explicitly in the metallization lift-off pattern 134, but it will be understood that this is present. A p-contact metal 140 is then evaporated onto the metallization lift-off pattern 134 and through the opening 136 to cover the contact window 132, using an e-beam evaporator. The unwanted metallization is removed via a lift-off step that removes the metallization lift-off pattern 134, leaving the p-contact 140 for the device. The p-contact extends beyond the edges of the contact window 132 and seals the contact opening in the SiO$_2$ layers 120 and 130, as is shown in FIGS. 14(a) and 14(b). An n-contact 142 for the laser is also evaporated using e-beam evaporation on the back side of the wafer, as described above. It will be understood that multiple photonic devices are typically fabricated on the substrate.

Photonic devices fabricated using the prior art process had low reliability and the performance of these devices noticeably degraded, especially in non-hermetic environments, within days. The photonics devices fabricated with the process of the present invention have shown exceptional reliability even in non-hermetic environments with a projected reliability of many years under normal usage.

The key difference between the present structure and that of the prior art that has resulted in the reliable operation of photonic devices is that all the semiconductor surfaces are passivated with SiO$_2$ or metal, as illustrated in FIGS. 14(a) and (b), prior to the singulation step described with reference to FIG. 2, and no bare or unprotected semiconductor is present near the facet at the active region of the device. When the substrate is later singulated, for example along singulation lines 144 of FIGS. 14(a) and (b), to separate adjacent photonic structures, bare semiconductor surfaces are created around the structures at the singulation lines. However, these bare surfaces typically are far (e.g., are more than 750 nm) from the etched facets provided at the active regions in the structures, as illustrated by the singulation lines 144. As a result of the present process and the resulting structure, corrosive and destructive elements in the environment are unable to penetrate the photonic device in way that leads to the rapid degradation seen in the prior art.

Although the present invention has been illustrated in terms of preferred embodiments, it will be understood that variations and modifications may be made without departing from the true spirit and scope thereof as set out in the following claims.

What is claimed is:

1. A photonic device comprising:
   a substrate;
   a semiconductor structure on said substrate, said semiconductor structure comprising:
   an active layer; and
   etched end facets and etched side walls defining all side surfaces of said semiconductor structure comprising said active layer, wherein said side surfaces are formed on a first portion of said semiconductor structure including said active layer, and wherein a second portion of said semiconductor structure extends laterally beyond each of said side surfaces; and
   a protective layer of a combination of a dielectric material and an electrically conductive material covering all surfaces of said semiconductor structure including:
   a single continuous layer of a dielectric material directly covering said etched end facets and each of said etched side walls and a first portion of a top surface of said semiconductor structure above said active layer, wherein said active layer extends to said etched end facets and each of said etched side walls, and wherein said single continuous layer of dielectric material directly covers said active layer at said etched end facets and each of said etched side walls to seal said etched end facets and each of said etched side walls; and
   a single continuous layer of an electrically conductive material directly covering a remaining portion of said top surface of said semiconductor structure only above said active layer, wherein said single continuous layer of electrically conductive material directly overlaps said single continuous layer of dielectric material to seal said top surface of said semiconductor structure;
   wherein said photonic device is a ridge laser.

2. The photonic device of claim 1, wherein said substrate is InP.

3. The photonic device of claim 1, wherein said substrate is GaAs.

4. The photonic device of claim 1, wherein said substrate is GaN.

5. The photonic device of claim 1, wherein said dielectric material is silicon dioxide.

6. The photonic device of claim 1, wherein said ridge laser comprises a ridge having a top surface and a plurality of side surfaces and a contact window disposed at said ridge top surface, and wherein said single continuous layer of dielectric material completely covers each of said ridge top and side surfaces except for said contact window.

7. The photonic device of claim 1, wherein said substrate has a singulation edge no less than about 750 nm from said etched end facets and said etched side walls, and wherein said single continuous layer of dielectric material completely covers said substrate between said etched end facets and said etched side walls and said singulation edge.

8. The photonic device of claim 1, wherein said single continuous layer of dielectric material completely covers a top surface of a portion of said semiconductor structure that extends laterally beyond said side surfaces below said active layer.

9. The photonic device of claim 1, wherein said semiconductor structure further comprises:
   a cladding region located below said active layer.

10. The photonic device of claim 9, further comprising:
    a second cladding region located above said active layer.

11. The photonic device of claim 10, further comprising:
    a cap layer located above said second cladding region; and
    a contact window defined by said single continuous layer of dielectric material on said top surface of said semiconductor structure, said contact window exposing at least a portion of said cap layer on said top surface of said semiconductor structure.

12. The photonic device of claim 11, wherein said single continuous layer of electrically conductive material is formed at least in part on said exposed portion of said cap layer.

13. The photonic device of claim 12, wherein said single continuous layer of electrically conductive material completely covers said contact window and directly overlaps said single continuous layer of dielectric material to completely seal said contact window.

14. The photonic device of claim 11, wherein said contact window is spaced away from and does not extend to said side surfaces of said semiconductor structure.

15. The photonic device of claim 1, further comprising:
    an electrically conductive contact formed on a bottom surface of said substrate opposite said semiconductor structure.

16. The photonic device of claim 1, wherein said protective layer comprises a single continuous layer of deposited dielectric material.

17. The photonic device of claim 16, wherein said single continuous layer of deposited dielectric material also extends over said substrate and covers all surfaces of said substrate within 750 nm of said etched end facets and said etched side walls.

18. The photonic device of claim 1, wherein said single continuous layer of electrically conductive material forms an electrically conductive contact for said photonic device.

* * * * *